United States Patent
Suzuki et al.

(10) Patent No.: US 7,485,410 B2
(45) Date of Patent: *Feb. 3, 2009

(54) METHOD OF MANUFACTURING THICK DIELECTRIC PATTERN AND METHOD OF MANUFACTURING IMAGE DISPLAYING APPARATUS

(75) Inventors: Masaaki Suzuki, Yokohama (JP); Osamu Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 480 days.

This patent is subject to a terminal disclaimer.

(21) Appl. No.: 11/166,105

(22) Filed: Jun. 27, 2005

(65) Prior Publication Data

US 2006/0003480 A1    Jan. 5, 2006

(30) Foreign Application Priority Data

Jun. 30, 2004  (JP) ............................. 2004-193199
Jul. 30, 2004  (JP) ............................. 2004-222958

(51) Int. Cl.
*G03F 7/26* (2006.01)
(52) U.S. Cl. .................. 430/311; 430/319; 430/330
(58) Field of Classification Search ................ 430/311, 430/313, 319, 330
See application file for complete search history.

(56) References Cited

U.S. PATENT DOCUMENTS

| 5,052,033 A | 9/1991 | Ikeda et al. | 378/35 |
| 6,866,989 B2 | 3/2005 | Watanabe et al. | 430/394 |
| 2003/0049572 A1 | 3/2003 | Watanabe et al. | 430/394 |
| 2004/0185379 A1* | 9/2004 | Iha | 430/312 |
| 2006/0003264 A1 | 1/2006 | Watanabe et al. | 430/312 |

FOREIGN PATENT DOCUMENTS

JP    2003-195513    7/2003

* cited by examiner

*Primary Examiner*—Kathleen Duda
(74) *Attorney, Agent, or Firm*—Fitzpatrick, Cella, Harper & Scinto

(57) ABSTRACT

A method of manufacturing a thick dielectric pattern disposed on a substrate. A first precursor layer is formed by imparting a first photosensitive dielectric paste, including a dielectric material, onto a substrate and drying it. A second precursor layer is formed by imparting a second photosensitive dielectric paste, including a dielectric material higher in softening point than the dielectric material included in the first photosensitive dielectric paste, on the first precursor layer and drying it. Precursor patterns are formed by collectively exposing and developing the layered products of the first precursor layer and the second precursor layer through the mask of a predetermined pattern, and a thick dielectric pattern is formed by collectively baking the precursor patterns.

3 Claims, 1 Drawing Sheet

METHOD OF MANUFACTURING THICK DIELECTRIC PATTERN AND METHOD OF MANUFACTURING IMAGE DISPLAYING APPARATUS

This application claims priority from Japanese Patent Application No. 2004-193199, filed on Jun. 30, 2004, and No. 2004-222958, filed on Jul. 30, 2004, which are hereby incorporated by reference herein.

BACKGROUND OF THE INVENTION

1. Field of the Invention

The present invention relates to a method of manufacturing a thick dielectric pattern, such as an insulating material pattern disposed on a substrate on which electron-emitting members are disposed, an interlayer insulating layer pattern disposed among a plurality of wirings, a bulkhead pattern formed on a substrate, such as a plasma display, a dielectric pattern, an insulating material pattern formed on the substrate, such as a circuit board, and the like, and a method of manufacturing an image displaying apparatus.

2. Related Background Art

In dielectric patterns constituting various displays, as a method of manufacturing a thick dielectric pattern formed thick to acquire desired insulating properties, for example, a method of using a photosensitive paste as disclosed in Japanese Patent Application Laid-Open No. 2003-195513 is cited. This method is in which a step of subjecting a photosensitive paste layer imparted on a substrate to light exposure more than once for developing and backing is performed or the step of imparting the photosensitive paste on the substrate for exposing and baking is repeated more than once, thereby acquiring a highly accurate member pattern having little pattern shrinkage due to baking, without leaving a backing residual in the pattern edge.

However, since the method disclosed in Japanese Patent Application Laid-Open No. 2003-195513 repeats the light exposure more than once, a positioning at each exposure time is complicated. Further, the method of manufacturing a stabilized thick dielectric pattern, which attempts to improve more a three-dimensional shape (forward tapered shape tilted toward the outside of a lateral edge portion and flat property of the top surface portion), is desired without increasing a number of steps required.

SUMMARY OF THE INVENTION

The present invention provides a method of manufacturing a thick dielectric pattern with a few number of steps and more highly accurate pattern accuracy, and moreover, provides a method of manufacturing a stabilized thick dielectric pattern, which is excellent in a three-dimensional shape (forward tapered shape tilted toward the outside of a lateral edge portion and flat property of the top surface portion).

The present invention provides a method of manufacturing a thick dielectric pattern, the thick dielectric pattern being disposed on the substrate, the method comprising the steps of forming a first precursor layer by imparting a first photosensitive dielectric paste, including a dielectric material, onto a substrate and drying it, forming a second precursor layer by imparting a second photosensitive dielectric, paste including a dielectric material higher in average softening point than the dielectric material included in the first photosensitive dielectric paste, onto the first precursor layer and drying it, forming precursor patterns by collectively exposing and developing the precursors of the first precursor layer and the second precursor layer through the mask of a predetermined pattern, and forming a thick dielectric pattern by collectively baking the precursor patterns.

Further, the present invention provides a method of manufacturing an image displaying apparatus, which comprises a plurality of electron-emitting members, a plurality of row-directional wirings and a plurality of column-directional wirings, which wire the plurality of electron-emitting members in a matrix pattern, and a thick dielectric pattern disposed between the row-directional wiring and the column-direction wiring, wherein the thick dielectric pattern is manufactured by the above-described method.

DETAILED DESCRIPTION OF THE PREFERRED EMBODIMENTS

Figure 1A:
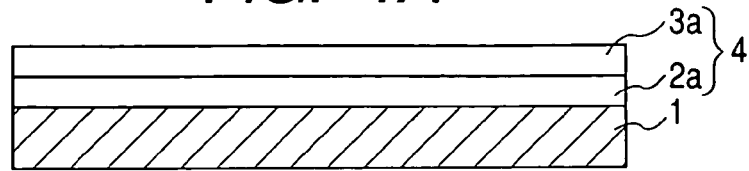
FIGS. 1A, 1B, 1C, 1D, and 1E are sectional schematic illustrations showing the steps of the preferred embodiment of the method of manufacturing of the present invention.

The first aspect of the present invention is a method of manufacturing a thick dielectric pattern being disposed on the substrate, the method comprising the steps of forming a first precursor layer by imparting a first photosensitive dielectric paste, including a dielectric material, onto a substrate and drying it, forming a second precursor layer by imparting a second photosensitive dielectric paste, including a dielectric material higher in average softening point than the dielectric material included in the first photosensitive dielectric paste, onto the first precursor layer and drying it, forming precursor patterns by collectively exposing and developing the layered products of the first precursor layer and the second precursor layer through the mask of a predetermined pattern, and forming a thick dielectric pattern by collectively baking the precursor patterns.

Further, the second aspect of the present invention is a method of manufacturing an image displaying apparatus comprising a plurality of electron-emitting members, a plurality of row-directional wirings and a plurality column-directional wirings, which wire the plurality of electron-emitting members in a matrix pattern, and a thick dielectric pattern disposed between the row-directional wiring and the column-directional wiring, wherein the thick dielectric pattern is manufactured by the first method of the present invention.

In the present invention, since layered products are collectively exposed to form a precursor pattern, the exposing step is for one time only, and highly accurate exposure can be executed. Further, since the layered product is softened at higher temperatures in the upper layer, so that it is shrunk in volume, the upper layer works as the distortion control member of the lower layer at the shrinking time of the lower layer with a result that an excellent three-dimensional shape (forward tapered shape tilted toward the outside of a lateral edge portion and flat property of the top surface portion) having no apparent overhang in a pattern edge portion can be acquired.

Hence, according to the present invention, the thick dielectric pattern can be efficiently provided with the fewer number of steps and high accuracy, and through the use of the pattern as an insulating layer, an image displaying apparatus capable of displaying a high quality image can be provided.

An embodiment of the present invention will be described below.

A thick dielectric pattern manufactured by the present invention is adapted to a dielectric pattern, such as an insulating material pattern disposed on a substrate on which electron-emitting members are disposed, an interlayer insulating layer pattern disposed among a plurality of wirings, a bulkhead pattern formed on a substrate, such as a plasma display, a dielectric pattern, and an insulating material pattern formed on the substrate, such as a circuit board, and the like. Particularly, the insulating material pattern disposed on the substrate on which electron-emitting members are disposed, and the interlayer insulating layer pattern disposed among a plurality of wirings are the preferred mode of embodiments adapted to the present invention in view of the fact that the formed film thickness thereof is approximately 10 μm to 30 μm, and it sharply affects the three-dimensional shape.

FIGS. 1A to 1E are sectional schematic illustrations showing the steps of one embodiment of the method of manufacturing the present invention. Each step of the present invention will be described in detail along with FIGS. 1A to 1E.

<Step 1>

A first photosensitive dielectric paste is imparted on a substrate 1 and is dried, thereby forming a first precursor layer 2a. Next, a second photosensitive dielectric paste is imparted on the first precursor layer 2a and is dried, thereby forming a second precursor layer 3a. Thus, the layered product 4 of the first precursor layer 2a and the second precursor layer 3a are formed (FIG. 1A).

In the present invention, the dielectric material included in the second photosensitive dielectric paste is higher in softening point than is the dielectric material. As the photosensitive dielectric paste used in the method of manufacturing the present invention, a paste added with a glass frit as the dielectric material is preferably used, the glass frit being added with singly or more than two types of lead oxide and bismuth oxide as a main component in photosensitive organic principle, solvent, and the like. In the present invention, the first and second photosensitive dielectric pastes may be added with glass frits different in the softening point, respectively. The glass frit may be used singly or more than two types of glass frits different in the softening point may be used in combination.

As the method of imparting each photosensitive dielectric paste, a usual screen printing method, a bar code method, and the like, can be used, thereby forming a paste to a thick film of 5 μm to 40 μm.

<Step 2>

Figure 1B:
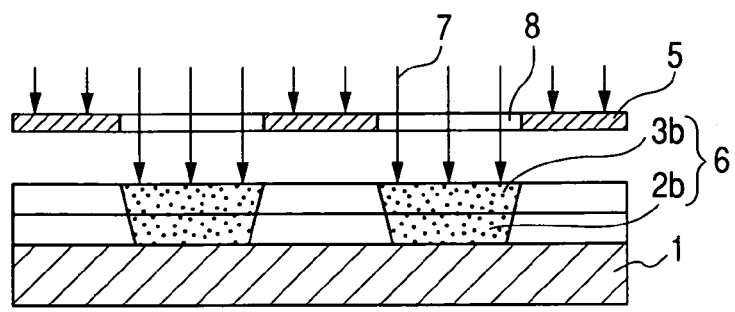

A layered product 4 formed in step 1 is subjected to one-shot exposure through a mask 5 having a predetermined pattern. Each of the precursor layers 2a and 3a is photo-polymerized so as to become a precursor pattern comprising quench-hardened layers 2b and 3b (FIG. 1B). Usually, light exposure is executed in such a manner that parallel rays 7 are aligned on a predetermined place by a proximity aligner, and are irradiated to the layered product 4 via micro-gaps through an opening portion 8 of the mask 5 corresponding to a desired thick member pattern 9. At this time, since each of the precursor layers 2a and 3a is collectively exposed, each of the quench-hardened layers 2b and 3b, which are latent images, is not generated with a positional shift, and eventually, a uniform sectional shape can be acquired.

However, the light having a wavelength in the vicinity of 365 nm, which contributes to photosensitivity accordingly as it streams downward, is attenuated due to absorption and dispersion in the materials, thereby narrowing the latent image width, and, therefore, as shown in FIG. 1B, the latent image width almost continuously becomes narrower from the quench-hardened layers 3b to 2b.

<Step 3>

Figure 1C:
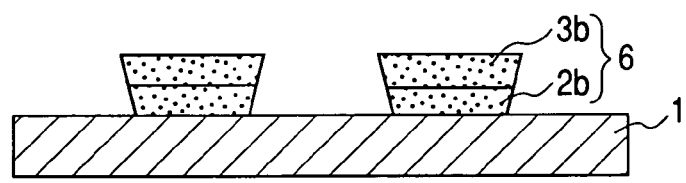

FIG. 1C shows a state after the one-shot exposure. Usually, developing is performed by a weak alkali solution, which is soluble for unexposed portions, and after that, the developing is stopped by a pure water rinse, and water-removing drying out is executed by an air-knife. In the present invention, unexposed portions of both layers of the first precursor layer 2a and the second precursor layer 3a are simultaneously subjected to one-shot developing by using a soluble developer.

<Step 4>

Figure 1D:
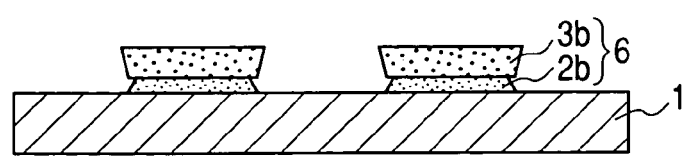

A precursor pattern 6 is baked. Through baking, each of the quench-hardened layers 2b and 3b of the precursor pattern 6 is drifted and shrunk in volume, while softening, coupling, and melting. In the present invention, since the average softening point of the dielectric material included in the quench-hardened layer 3b is higher than the softening point of the dielectric material included in the quench-hardened layer 2b, first, at temperatures lower than the softening temperature of the dielectric material included in the quench-hardened layer 3b, the volume shrinkage of the quench-hardened layer 2b proceeds (FIG. 1D). Although the shape distortions of the quench-hardened layer 2b are in the direction parallel to the substrate 1 and in the film thickness direction, at this time, since the volume shrinkage of the quench-hardened layer 3b does not proceed very much, the quench-hardened layer 3b works as the distortion control member of the quench-hardened layer 2b, and the volume shrinkage of the quench-hardened layer 2b is uniform at every place with the volume shrinkage in the film thickness direction not rising in its pattern.

As a kiln, in general, a circulating hot air oven in atmosphere and a far-infrared heater-heating oven in atmosphere and, moreover, under forced introduction of air, can be used.

Figure 1E:
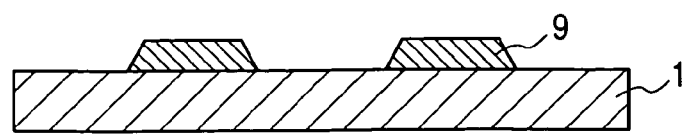

FIG. 1E is a view showing a state after the temperature rise further proceeds from the state of FIG. 1D until it reaches the highest reachable temperature where the baking is performed. The temperature rises further than that shown in FIG. 1D, and the dielectric materials included in the quench-hardened layer 3b are softened and coupled, and the volume shrinkage starts, and the temperature rises to the softening point of the dielectric materials, and after that, while being kept for a few minutes, the materials start melting at almost the whole area, and then, the temperature fall starts until it is restored to room temperature, so that a desired pattern completely integrated can be acquired.

The three-dimensional shape of the thick dielectric pattern thus formed can assure a flat property of the top surface, and in particular, the edge portion does not become overhang-shaped from the ground (substrate boundary face) to the upper layer, and a well-regulated forward tapered shape is formed on the whole surface.

EXAMPLES

The present invention will be described below in detail by citing specific examples.

Example 1

An insulating pattern disposed between upper and lower electrodes for an electron source substrate, wherein electron-emitting members for an image display apparatus are disposed, was manufactured by the method of manufacturing of the present invention.

As a substrate, soda lime glass is used, and on this substrate, first, an electron-emitting member and the lower electrode connected to this member were formed. As the lower electrode, a Pt material 50 nm in film thickness was formed to a desired thin film pattern by common photolithography etching.

Next, a first photosensitive dielectric paste was formed by a screen printing method. Although a form plate of the screen printing is properly used according to the film thickness starting from a desired ultimate thickness, and, in this case, a form plate comprising a wire made of stainless steel having a diameter of 55 μm, which is No. 145 (number of the wires per 1 inch), was used. Further, as the photosensitive dielectric paste, two types of a glass frit 1 mainly comprising lead oxide with a glass softening point of approximately 440° C. as a single substrate and a glass frit 2 mainly comprising lead oxide with a glass softening point of approximately 530° C. as a single substance were mixed, so as to prepare a dielectric material with a softening point of approximately 480° C., and a component containing a mass ratio of approximately twenty to forty percent by putting together an organic component and a solvent component having photosensitivity was used. After that, for the purpose of volatilizing and drying, the solvent was dried for approximately fifteen minutes at approximately 100° C. by hot air and an infrared IR heater. The film thickness of the first precursor layer after drying was approximately 26 μm.

Next, only the glass frit 2 was used as the dielectric material, and by putting together the organic component and a solvent component having photosensitivity, a second photosensitive dielectric paste containing a mass ratio of approximately twenty to forty percent was formed by the same method as that of the first photosensitive dielectric paste, and was dried. The film thickness of the second precursor layer after the drying was approximately 25 μm, and became approximately 51 μm with the first precursor layer put together.

Next, a mask having an opening portion corresponding to a desired insulating pattern was aligned so as to be exposed at a desired place, and a gap between the mask and the second precursor layer was adjusted to be approximately 100 μm, and was exposed with an exposure value of 100 mJ/cm².

After the exposure, both of the unexposed portions of the first and second precursor layers were developed with a soluble weak alkali solution, and after that, the developing was stopped by a pure water rinse, and water-removing drying out was practiced by an air-knife, thereby acquiring a precursor pattern with upper and lower quench-hardened layers being integrated.

After that, by the oven of the IR heater heating type, which heats and cools by stages, while further forcibly introducing air under the atmosphere, the precursor pattern with upper and lower quenched-hardened layers being integrated was subjected to collective baking. In the course of its temperature rising, first, the solvent component and the organic component remaining in the two photosensitive pastes were burnt until reaching approximately 400° C., and disappeared. After that, the temperature rise was further expedited, and the glass frit was softened and coupled from the vicinity of the temperature being several tens of degrees lower than the softening point (480° C. in this case) of the glass frit of the lower quench-hardened layer, and the volume shrinkage started, and at the temperature passing further around 480° C., the glass frit drifted, while melting. However, at this time, since the temperature was still lower than the softening point (530° C.) of the glass frit contained in the upper quench-hardened layer, the volume shrinkage of the quench-hardened layer was in a state not much advanced, and the volume shrinkage in the film thickness direction of the lower quench-hardened layer was uniform everywhere without any risen edge.

The temperature rising was still continued, and at a temperature 30° C. lower than the softening point (530° C.) of the glass frit contained in the upper quench-hardened layer, the glass frit was softened and coupled similarly to the case of the lower layer, and the volume shrinkage started, and then, the temperature was increased to the softening point (530° C.), and was kept there for about ten minutes. When the melting was effected for almost the whole area, the temperature fall was expedited until it returned to room temperature, thereby acquiring a desired dielectric pattern.

Although the acquired insulating pattern was shrunk approximately 50% in the film thickness direction with the film thickness of approximately 26 μm, its three-dimensional shape could assure a flatness property of the top surface, and, in particular, the edge portion did not become overhang-shaped from the ground (substrate boundary face) to the upper layer, and was formed in an excellent forward tapered shape.

After that, an Ag paste was pattern-formed with a film thickness of approximately 8 μm on this insulating pattern as the upper electrode so as to be connected to the lower electrode via a through-hole by the screen printing and baking.

In the electron source substrate thus manufactured, a connection failure incidence between the lower electrode and the upper electrode at the through-hole of the insulating pattern was below 0.1 ppm, and was sharply reduced than the connection failure incidence 3.0 ppm when the electron source substrate was formed by the method disclosed in Japanese Patent Application Laid-Open No. 2003-195513.

Example 2

Interlayer insulating patterns of row-directional wirings and column-directional wirings of an image displaying apparatus electron source substrate were manufactured by the method of manufacturing of the present invention.

As the substrate, a low distortion point glass PD 200 (Asahi Glass Co., Ltd.) was used, and on this substrate, first, a plurality of row-directional electron-emitting members and a plurality of column-directional wirings connecting these electron-emitting members for every column were formed. As the column-directional wiring, a silver paste (glass frit, and the like) imparted with a photosensitivity was pattern-formed in a striped shape with a film thickness of approximately 5 μm and a width of approximately 35 μm by coating on the whole surface, heating and drying, exposure, developing, and baking by a screen printing method.

On this substrate, the layered product of precursors was formed by using the first photosensitive dielectric paste and the second photosensitive dielectric paste, similar to Example 1. However, to obtain a desired film thickness, the first photosensitive dielectric paste has used the form plate No. 200 (25.4 mm per piece) of a wiring rod of 40 μm made of stainless steel, and the second photosensitive dielectric paste had used the form plate No. 145 (25.4 mm per piece) of a wiring rod of 55 μm made of stainless steel. Both of the pastes were formed into a film by screen printing, and for the purpose of volatilizing and drying the solvent, the drying for about fifteen minutes at approximately 100° C. was executed. The film thickness after the drying was approximately 19 μm for the first precursor layer and approximately 25 μm for the second precursor layer, and the film thickness of the layered product became approximately 44 μm in total.

Next, similar to Example 1, each of the exposure and the developing was collectively executed, and after that, one shot baking (maximum reachable temperature 530° C. kept for ten minutes after the temperature increase) was executed on the precursor pattern integrated with the upper and lower layers, thereby acquiring a plurality of stripe shaped interlayer insulating layer patterns orthogonal to the column-directional wirings. As a result, though a total film thickness was shrunk by approximately 22 μm, and shrunk also by approximately 50% in the film thickness direction, the three-dimensional shape thereof was allowed to assure the flatness of the top surface similar to Example 1, and further, the edge portion did not become overhand-shaped from the ground (substrate boundary face) to the upper layer, and an excellent forward tapered shape was formed.

After that, on the acquired interlayer insulating pattern, a plurality of column-directional wirings orthogonal to the row-directional wirings were formed. As the row-directional wirings, Ag paste was pattern-formed in a stripe shape by screen printing and baked. Incidentally, on the interlayer insulating layer, similar to Example 1, a through-hole is formed, and by such a through-hole, the electron-emitting material is connected to the row-directional wiring for each row. Thus, an electron source substrate, where a plurality of row-directional electron-emitting members are matrix-wired by mutually insulated row-directional wirings and column-directional wirings, is formed.

When the interlayer insulating layer pattern thus manufactured was used for the image displaying apparatus electron source substrate, a gap between an opposed substrate (anode) and the electron source substrate was approximately 1.5 mm, and a rate of occurrence of abnormal electrical discharge between both substrates when given a potential difference of 12 kV for ten minutes was reduced by approximately $1/10$. It was sharply reduced further than a rate of occurrence of 3.0 ppm of the connection failure when the interlayer insulating layer pattern was manufactured by the manufacturing method disclosed in Japanese Patent Application Laid-Open No. 2003-195513. Further, as the interlayer insulating layer as its intrinsic function, a rate of occurrence of defects, such as an electrical short-circuit between the row-direction wiring and the column-directional wiring due to the occurrence, and the like, of partial pin holes, was approximately 0.3 ppm, and it was reduced approximately $1/10$ than a rate of occurrence of 3.0 ppm of the connection failure when the interlayer insulating layer was manufactured by the manufacturing method disclosed in Japanese Patent Application Laid-Open No. 2003-195513.

What is claimed is:

1. A method of manufacturing a thick dielectric pattern disposed on a substrate, said manufacturing method comprising the steps of:
    forming a first precursor layer by imparting a first photosensitive dielectric paste, including a dielectric material, onto a substrate and drying it;
    forming a second precursor layer by imparting a second photosensitive dielectric paste, including a dielectric material higher in softening point than the dielectric material included in the first photosensitive dielectric paste, on the first precursor layer and drying it;
    forming precursor patterns by collectively exposing and developing the layered products of the first precursor layer and the second precursor layer through the mask of a predetermined pattern; and
    forming a thick dielectric pattern by collectively baking the precursor patterns.

2. The method of manufacturing a thick dielectric pattern according to claim 1, wherein the dielectric material is one of a single glass frit and a mixture of glass frits different in softening point.

3. A method of manufacturing an image displaying apparatus, which includes: (i) a plurality of electron-emitting members, (ii) a plurality of row-directional wirings and a plurality of column-directional wirings, which wire the plurality of electron-emitting members in a matrix pattern, and (iii) a thick dielectric pattern disposed between the row-directional wiring and the column-directional wiring, said method comprising:
    manufacturing the thick dielectric pattern by the method according to claim 1 or claim 2.

* * * * *